(12) United States Patent
Oishi et al.

(10) Patent No.: US 9,143,091 B2
(45) Date of Patent: Sep. 22, 2015

(54) DISTORTION COMPENSATING APPARATUS, TRANSMITTER, DISTORTION COMPENSATING METHOD, AND TRANSFER FUNCTION CALCULATING METHOD

(71) Applicant: FUJITSU LIMITED, Kawasaki-shi, Kanagawa (JP)

(72) Inventors: Yasuyuki Oishi, Shibuya (JP); Eisuke Fukuda, Yokohama (JP); Yoshimasa Daido, Nonoichi (JP)

(73) Assignee: FUJITSU LIMITED, Kawasaki (JP)

( * ) Notice: Subject to any disclaimer, the term of this patent is extended or adjusted under 35 U.S.C. 154(b) by 63 days.

(21) Appl. No.: 14/060,672

(22) Filed: Oct. 23, 2013

(65) Prior Publication Data

US 2014/0139287 A1    May 22, 2014

(30) Foreign Application Priority Data

Nov. 20, 2012  (JP) .................................. 2012-254360

(51) Int. Cl.
| | |
|---|---|
| *H03F 1/32* | (2006.01) |
| *H03F 3/24* | (2006.01) |
| *H04L 27/36* | (2006.01) |
| *H04L 27/26* | (2006.01) |

(52) U.S. Cl.
CPC ............... *H03F 1/3247* (2013.01); *H03F 3/24* (2013.01); *H04L 27/2614* (2013.01); *H04L 27/368* (2013.01); *H03F 2201/3224* (2013.01)

(58) Field of Classification Search
USPC .................. 330/149, 291, 278; 375/296–297; 455/114.3
See application file for complete search history.

(56) References Cited

U.S. PATENT DOCUMENTS 7,170,345 B2 * 1/2007 Hongo .......................... 330/149

FOREIGN PATENT DOCUMENTS

JP      2009-200694     9/2009

OTHER PUBLICATIONS

J. H. K. Vuolevi, et al., "Measurement Technique for Characterizing Memory Effects in RF Power Amplifiers", IEEE Transactions on Microwave Theory Techniques, vol. 49, No. 8, Aug. 2001, pp. 1383-1389.
J. Kim, et al.,"Digital predistortion of wideband signals based on power amplifier model with memory", Electronics Letters. vol. 37, No. 23, Nov. 8, 2001, pp. 1417-1418.

(Continued)

*Primary Examiner* — Hieu Nguyen
(74) *Attorney, Agent, or Firm* — Fujitsu Patent Center

(57) ABSTRACT

An amplifier module is expressed by a model having a first filter that is a linear time-invariant filter for limiting the bandwidth of an input signal, an amplifier unit that amplifies a signal output from the first filter, and a second filter that is a linear time-invariant filter for limiting the bandwidth of a signal output from the amplifier unit. A memoryless amplifier unit calculates an output from the amplifier module when being memoryless, using AM-to-AM distortion and AM-to-PM distortion of the amplifier unit. A cross-correlation calculating unit calculates a correlation between the signal output from the amplifier module and the output calculated by the memoryless amplifier unit and calculates an estimate of a transfer function of the first filter and the second filter. A distortion compensating unit compensates the input signal based on the estimate of the transfer function and outputs the signal to the amplifier module.

6 Claims, 5 Drawing Sheets

(56) References Cited

OTHER PUBLICATIONS

J. S. Kenney, et al., "Identification of RF Power Amplifier Memory Effect Origins Third-Order Intermodulation Distortion Amplitude and Phase Asymmetry", IEEE MTT-S International, Jun. 11-16, 2006, pp. 1121-1124.

H. Ku, et al., "Quantifying Memory Effects in RF Power Amplifiers", IEEE Transactions on Microwave Theory Techniques, vol. 50, No. 12, Dec. 2002, pp. 2843-2849.

L. Ding, et al., "Effects of Even-Order Nonlinear Terms on Power Amplifier Modeling and Predistortion Linearization", IEEE Transactions on Vehicular Technology, vol. 53, No. 1, Jan. 2004, pp. 156-162.

L. Ding, et al., "A Robust Digital Baseband Predistorter Constructed Using Memory Polynomials", IEEE Transactions on Communications, vol. 52, No. 1, Jan. 2004, pp. 159-165.

J. Zhang, et al., "A Memory Polynomial Predistorter for Compensation of Nonlinearity with Memory Effects in WCDMA Transmitters", IEEE Communications, Circuits and Systems, 2009, pp. 913-916.

K. Nagatomo, et al., "GaAs MESFET Characterization Using Least Squares Approximation by Rational Functions", IEEE Transactions on Microwave Theory and Techniques, vol. 41, No. 2, Feb. 1993, pp. 199-205.

\* cited by examiner

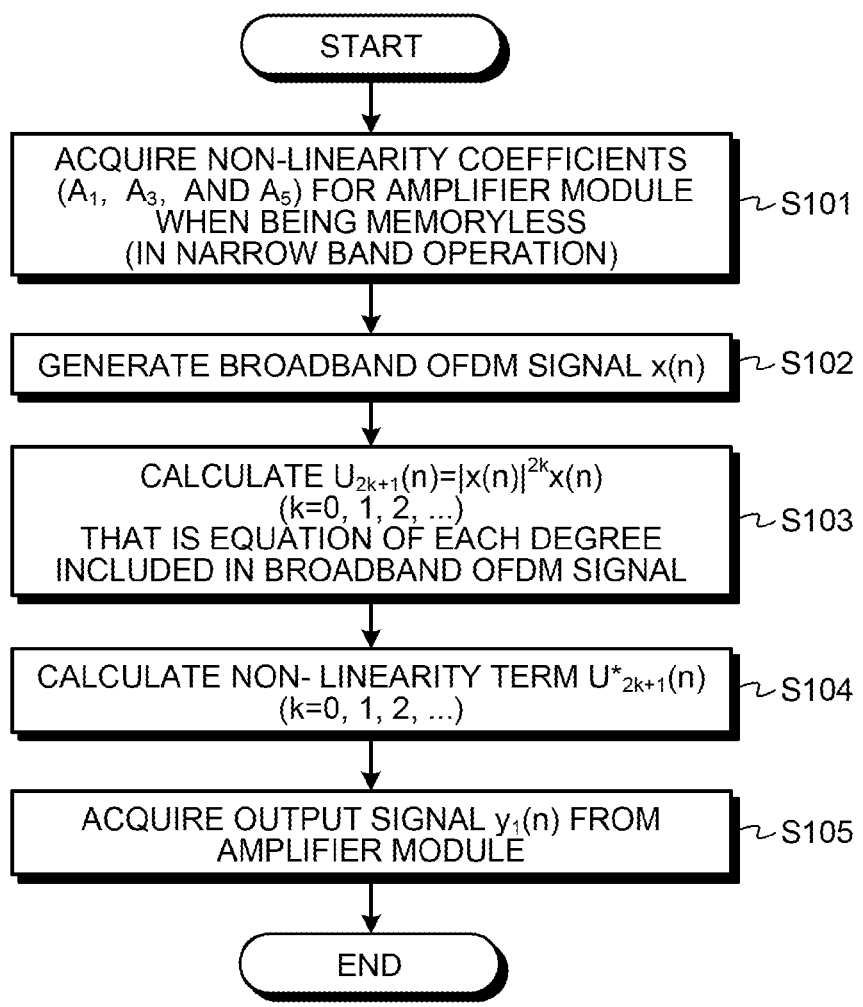

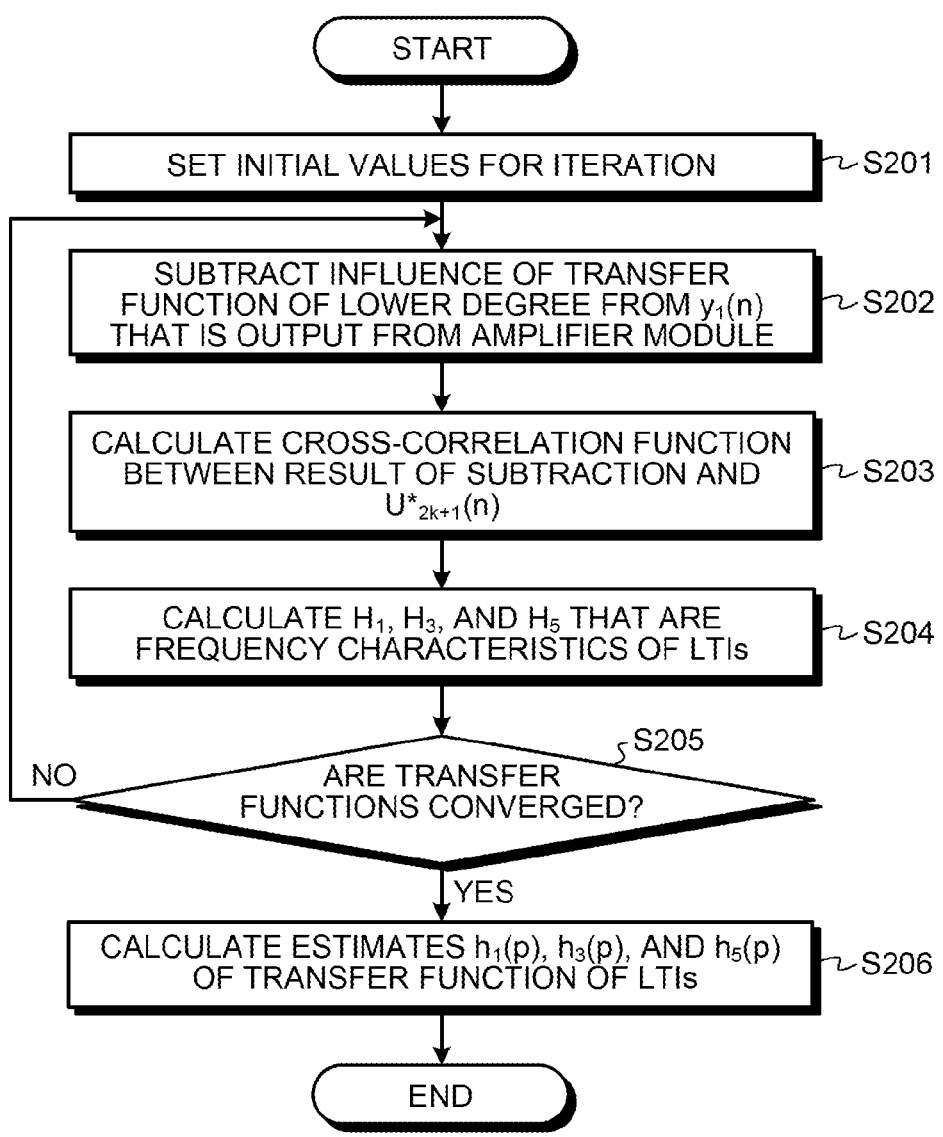

US 9,143,091 B2

DISTORTION COMPENSATING APPARATUS, TRANSMITTER, DISTORTION COMPENSATING METHOD, AND TRANSFER FUNCTION CALCULATING METHOD

CROSS-REFERENCE TO RELATED APPLICATION

This application is based upon and claims the benefit of priority of the prior Japanese Patent Application No. 2012-254360, filed on Nov. 20, 2012, the entire contents of which are incorporated herein by reference.

FIELD

The embodiment discussed herein is related to a distortion compensating apparatus, a transmitter, a distortion compensating method, and a transfer function calculating method.

BACKGROUND

Amplitude modulation (AM)-to-AM distortion and AM-to-phase modulation (PM) distortion have been considered as examples of nonlinear distortion occurring in a power amplifier used in a wireless system. Recently, the frequency bandwidths used in wireless systems have been continuously widened. As the bandwidths are widened, the impact of distortion caused by a memory effect, which is dynamic distortion dependent on a variation and a past history of signals input to the power amplifier, as well as AM-to-AM distortion and AM-to-PM distortion, are no longer ignorable. To improve power amplifier characteristics related to compensation of non-linear distortion, it has recently become important to understand how the power amplifier behaves under the memory effect and to correct distortion including distortion caused by the memory effect.

The memory effect is considered to be caused by a plurality of factors affecting each other. Examples of such factors include those caused by a member included in an amplifier circuit provided to the power amplifier, those dependent on frequency characteristic of a radio frequency (RF) circuit provided to the amplifier circuit, and those dependent on the frequency characteristic of a bias circuit that determines the operating point of the amplifier circuit.

Available as a model for expressing the memory effect that is dependent on the frequency characteristic of the RF circuit provided to the amplifier circuit is a Wiener-Hammerstein (W-H) type amplifier. The W-H type amplifier is an amplifier assumed to have a configuration in which linear time-invariant (LTI) filters are positioned before and after the amplifier circuit, respectively. Hereinafter, the LTI filter assumed to be positioned before or after the amplifier circuit are referred to as an "LTI".

As a conventional technology for compensating for distortion caused by the memory effect, Japanese Laid-open Patent Publication No. 2009-200694 discloses a technology that uses predistortion, in which a signal to be transmitted is compensated using the inverse characteristic of nonlinear distortion of the power amplifier.

However, in a W-H type amplifier, a power spectrum that is measurable as an output from the amplifier module includes only amplitude information of the signal to be transmitted, and phase information is lost. Therefore, it has been difficult to estimate a frequency characteristic or a transfer function of the LTIs when a W-H type amplifier is used. Furthermore, it has been difficult to measure or to estimate the characteristic of the amplifier circuit and the characteristic of the two LTIs connected before and after the amplifier circuit in a separate manner.

Furthermore, in a power amplifier using predistortion, every parameter included in a lookup table (LUT) or the like are updated. Therefore, parameters that changes slowly by a small degree are also updated, and a complex algorithm is used in the compensation. Therefore, it is difficult to perform the compensation quickly.

SUMMARY

According to an aspect of an embodiment, a distortion compensating apparatus includes: an amplifier that amplifies an input signal and is expressed by a model having a first filter that is a linear time-invariant filter for limiting a bandwidth of an input signal, an amplifier unit that amplifies a signal output from the first filter, and a second filter that is a linear time-invariant filter for limiting a bandwidth of a signal output from the amplifier unit; a memoryless output calculating unit that calculates an output from the amplifier when being memoryless for a first input signal, based on amplitude modulation (AM)-to-AM distortion and AM-to-phase modulation (PM) distortion of the amplifier unit; a transfer function estimate calculating unit that calculates a correlation between a signal output from the amplifier for the first input signal and an output for the first input signal calculated by the memoryless output calculating unit and calculates an estimate of a transfer function of the first filter and the second filter based on a resultant correlation thus calculated; and a distortion compensating unit that compensates a second input signal based on the estimate of the transfer function calculated by the transfer function estimate calculating unit and outputs the second input signal thus compensated to the amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a flowchart of a process of acquiring preliminary data; and

FIG. 5 is a flowchart of a process of calculating initial values to be used for iteration.

DESCRIPTION OF EMBODIMENTS

Preferred embodiments of the present invention will be explained with reference to accompanying drawings. The embodiment disclosed hereunder is not intended to limit the scope of the distortion compensating apparatus, the transmitter, the distortion compensating method, and the transfer function calculating method according to the present invention in any way.

Figure 1:
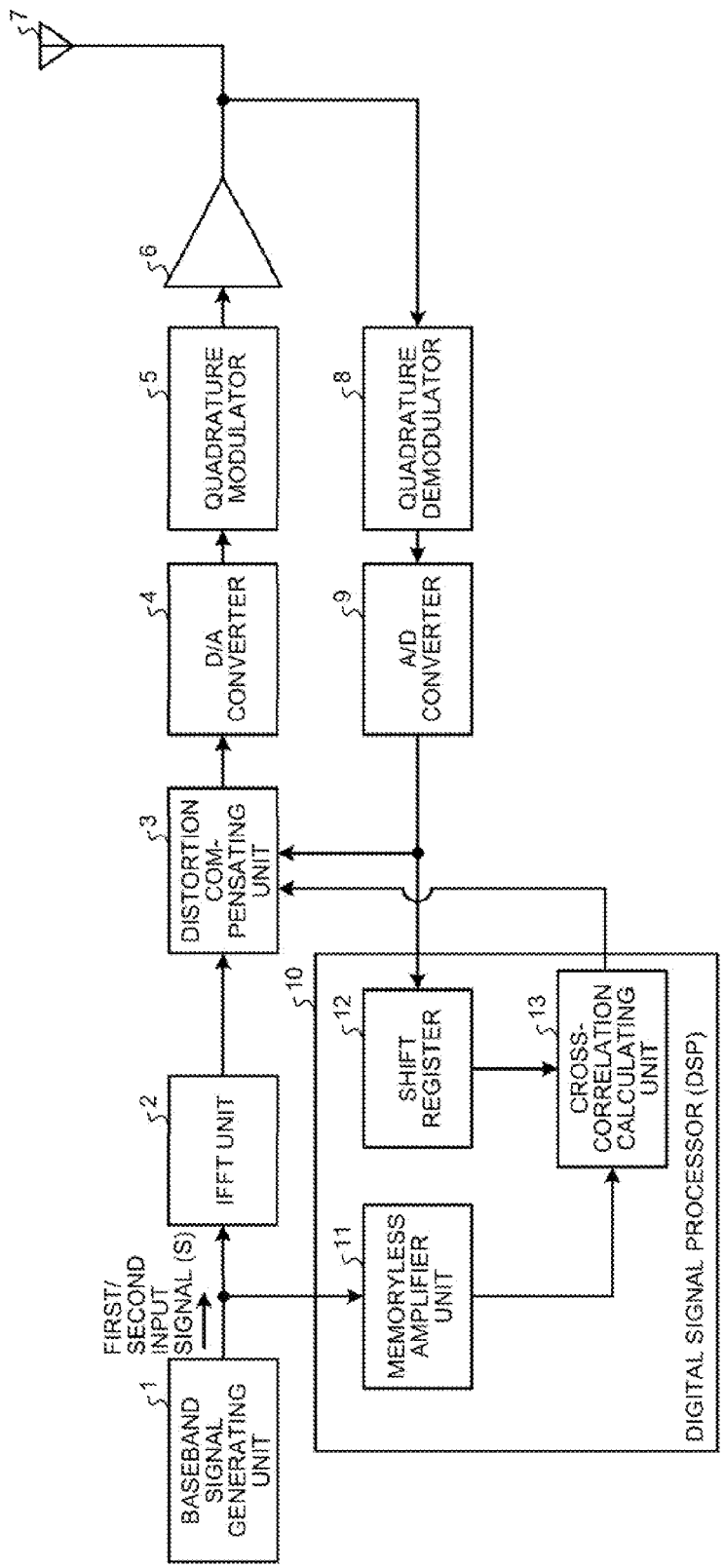
FIG. 1 is a block diagram of a transmitter according to an embodiment of the present invention.

FIG. 1 is a block diagram of a transmitter according to an embodiment of the present invention. As illustrated in FIG. 1, the transmitter according to the embodiment includes a baseband signal generating unit 1, an inverse fast Fourier transform (IFFT) unit 2, a distortion compensating unit 3, a digital-to-analog (D/A) converter 4, and a quadrature modulator 5. The transmitter according to the embodiment also includes an amplifier module 6, an antenna 7, a quadrature demodulator 8, an analog-to-digital (A/D) converter 9, and a digital signal processor (DSP) 10.

The baseband signal generating unit 1 generates a broadband orthogonal frequency-division multiplexing (OFDM) signal to be transmitted. The broadband OFDM signal is the baseband signal. Hereinafter, the broadband OFDM signal generated by the baseband signal generating unit 1 is simply referred to as an OFDM signal. The OFDM signal generated by the baseband signal generating unit 1 is denoted by x(n).

The baseband signal generating unit 1 outputs the OFDM signal thus generated to the IFFT unit 2 and the DSP 10.

The IFFT unit 2 receives an input of the OFDM signal from the baseband signal generating unit 1. The IFFT unit 2 modulates the OFDM signal by performing IFFT on the OFDM signal thus received, to generate carriers that are signals to be transmitted. The IFFT unit 2 then outputs the signals to be transmitted to the distortion compensating unit 3.

The distortion compensating unit 3 receives an input of the signals to be transmitted from the IFFT unit 2. The distortion compensating unit 3 receives an input of $h_k(p)$ that is an estimate of a transfer function of a long-term evolution (LTE) circuit for the amplifier module 6, which is to be described later, from the DSP 10 once in every given cycle. The distortion compensating unit 3 also receives an input of a feedback signal from the A/D converter 9.

The distortion compensating unit 3 acquires an error signals between the signal to be transmitted and the feedback signal. The distortion compensating unit 3 then acquires $A_k$ that is a non-linearity coefficient for the active element, using the error signals thus acquired. At this time, the distortion compensating unit 3 acquires $A_k$ that is a non-linearity coefficient for the active element at an earlier cycle that the cycle at which the input of $h_k(p)$ being the transfer function of the LTE circuit is received. The distortion compensating unit 3 then acquires a distortion compensation coefficient from $h_k(p)$ that is the transfer function of the LTE circuit and $A_k$ that is a non-linearity coefficient of the active element. Available as an example of a method for calculating the distortion compensation coefficient is a method in which the distortion compensating unit 3 is caused to calculate a non-linearity characteristic including $h_k(p)$ that is the transfer function of the LTE circuit thus acquired, and use the non-linearity characteristic thus acquired as a coefficient for predistortion (this method is sometimes referred to as "p-th order inverse").

The distortion compensating unit 3 then generates a predistorted signal by compensating the signal to be transmitted received from the IFFT unit 2 for the distortion using the distortion compensation coefficient thus acquired. The distortion compensating unit 3 then outputs the predistorted signal to the D/A converter 4.

The D/A converter 4 receives an input of the predistorted signals from the distortion compensating unit 3. The D/A converter 4 converts the predistorted signal that is a digital signal into an analog signal. The D/A converter 4 then outputs the predistorted signal having been converted into an analog signal to the quadrature modulator 5.

The quadrature modulator 5 receives an input of the predistorted signal in the form of an analog signal from the D/A converter 4. The quadrature modulator 5 then up-converts the predistorted signals thus received to a carrier frequency, thereby converting the predistorted signal into an RF signal.

The quadrature modulator 5 then outputs the predistorted signal converted into the RF signal to the amplifier module 6.

The amplifier module 6 receives an input of the predistorted signal that is an RF signal from the quadrature modulator 5. The amplifier module 6 then amplifies the predistorted signal thus received and generates a signal to be transmitted having the nonlinear distortion removed. The amplifier module 6 then outputs the signals to be transmitted thus generated. The signal to be transmitted output from the amplifier module 6 is split into two. One of the signals to be transmitted is transmitted to an external receiver via the antenna 7. The other is transmitted to the quadrature demodulator 8. The amplifier module 6 is an example of an "amplifier".

The quadrature demodulator 8 then receives an input of the signal to be transmitted output from the amplifier module 6. The quadrature demodulator 8 then generate a feedback signal by performing a quadrature demodulation to the signal to be transmitted thus received. The quadrature demodulator 8 then outputs the feedback signal to the A/D converter 9.

The A/D converter 9 receives an input of the feedback signal from the quadrature demodulator 8. The A/D converter 9 then converts the feedback signal which is an analog signal into a digital signal. The A/D converter 9 then outputs the feedback signal converted into a digital signal to the distortion compensating unit 3 and the DSP 10. Hereunder, the feedback signal output from the A/D converter 9 are denoted by $y_1(n)$.

The DSP 10 includes a memoryless amplifier unit 11, a shift register 12, and a cross-correlation calculating unit 13, as illustrated in FIG. 1.

The shift register 12 receives an input of y(n) that is the feedback signals from the A/D converter 9. The shift register 12 then outputs $y_1(n+m)$ that is the feedback signal having time shifted to the cross-correlation calculating unit 13 so that the feedback signal is used in a cross-correlation function.

The memoryless amplifier unit 11 then calculates an output from the amplifier module 6 that is a memoryless amplifier. Specifically, the memoryless amplifier unit 11 acquires an output of a memoryless amplifier corresponding to the amplifier module 6 from the calculation described below. Explained hereunder is an example in which up to a fifth degree is considered. Calculation of a higher degree enables the precision of the distortion compensation to be increased accordingly, but the amount of calculation is increased as well. Furthermore, because the amount of distortion is smaller in a frequency bandwidth corresponding to a higher degree, distortion in such a portion affects distortion compensation less. Therefore, it is preferable to determine the degrees considered based on the precision requested, the amount of calculation, and the like.

Figure 2:
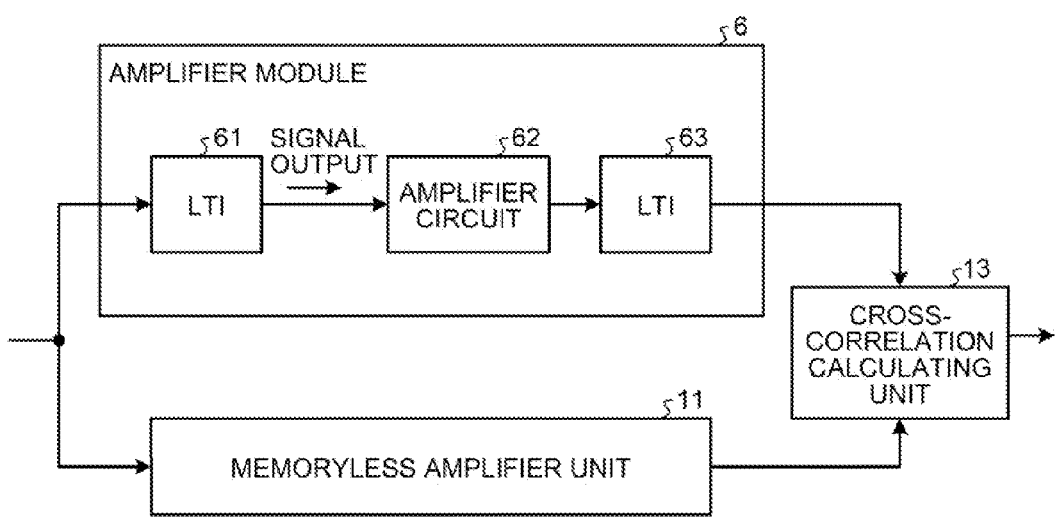
FIG. 2 is a schematic generally illustrating a process of calculating a transfer function according to the embodiment.

FIG. 2 is a schematic generally illustrating a process of calculating a transfer function according to the embodiment. In FIG. 2, the units used in calculating the transfer function is extracted from those illustrated in FIG. 1.

When the amplifier module 6 is modeled as a W-H type amplifier, which is a model having a configuration dependent on the frequency characteristic of an amplifier RF circuit, the amplifier module 6 can be considered to have an LTI 61, an amplifier circuit 62, and an LTI 63, as illustrated in FIG. 2. The LTI 61 is an example of a "first filter". The amplifier circuit 62 is an example of an "amplifier unit". The LTI 63 is an example of a "second filter".

The memoryless amplifier unit 11 stores therein an amount of nonlinear distortion calculated from the AM-to-AM characteristic and the AM-to-PM characteristic of the amplifier circuit 62. Specifically, non-linearity coefficients $A_1$, $A_3$, and $A_5$ corresponding to the nonlinear distortion can be estimated by taking out a term of each degree from the measurement of the AM-to-AM characteristic and the AM-to-PM characteristic of the amplifier circuit 62. For example, the non-linearity coefficient $A_3$ is a third-degree term of the AM-to-AM characteristic and the AM-to-PM characteristic.

The memoryless amplifier unit 11 stores therein $U_{2k+1}(n)=|x(n)|^{2k}x(n)$ (k=0, 1, 2, 3 . . . ) as an equation for extracting a term of each degree included in the received OMDF signal. For example, the memoryless amplifier unit 11 takes out a fifth-degree equation included in the OMDF signal as $U_5(n)=|x(n)|^4 x(n)$.

The memoryless amplifier unit 11 receives an input of x(n) that is the OFDM signal from the baseband signal generating unit 1. The memoryless amplifier unit 11 then acquires an equation corresponding to each degree from x(n) that is the received OFDM signal using the equations stored therein. In this embodiment, the memoryless amplifier unit 11 acquires first-, third-, and fifth-degree equations.

The memoryless amplifier unit 11 then multiplies each of the non-linearity coefficients $A_1$, $A_3$, and $A_5$ to corresponding one of the equations of the degrees, to calculate a value in which the nonlinear distortion is reflected to the equation of each degree. The result of adding the equations of the respective degrees with which the nonlinear distortion is reflected comes to represent the OFDM signal x(n) reflected with the nonlinear distortion. The nonlinear distortion in this case is acquired from the AM-to-AM characteristic and the AM-to-PM characteristic. Because the AM-to-AM characteristic and the AM-to-PM characteristic are not dependent on the frequency of the received OFDM signal, an output of the memoryless amplifier unit 11 corresponds to the output from the amplifier module 6 for the OFDM signal, output when the amplifier module 6 is memoryless.

The memoryless amplifier unit 11 outputs the output from the amplifier module 6 for the OFDM signal when the amplifier module 6 is memoryless to the cross-correlation calculating unit 13. Specifically, the memoryless amplifier unit 11 outputs the equation of each of the degrees reflected with the nonlinear distortion. The memoryless amplifier unit 11 corresponds to an example of a "memoryless output calculating unit".

The cross-correlation calculating unit 13 receives an input of the feedback signal having time shifted from the shift register 12. The cross-correlation calculating unit 13 also receives the output from the amplifier module 6 when being memoryless corresponding to the OFDM signal from the memoryless amplifier unit 11. In other words, the cross-correlation calculating unit 13 acquires $y_1(n+m)$ that is an output from the amplifier module 6 represented as a W-H type amplifier and $A_k U_{2k+1}$ that is the output from the amplifier module 6 when being memoryless, as illustrated in FIG. 2.

The cross-correlation calculating unit 13 then acquires a conjugate of the received output from the amplifier module 6 when the amplifier module 6 is memoryless. In other words, the cross-correlation calculating unit 13 acquires $U^*_{2k+1}(n)$ (k=0, 1, 2, 3 . . . ) where "*" is a conjugate.

The cross-correlation calculating unit 13 also determines $f_1(p)$ that is the initial value of the first degree LTI transfer function. Specifically, the cross-correlation calculating unit 13 divides the entire frequency characteristic acquired by the feedback signal by the frequency characteristic of the OFDM signal which is the input signal. The cross-correlation calculating unit 13 then acquires the initial value $f_1(p)$ by performing inverse Fourier transform on the result of the division, to convert the result of the division into a transfer function along temporal axis. The cross-correlation calculating unit 13 then acquires $f_3(p)$ that is the initial value of the third degree LTI transfer function using $f_1(p)$ thus calculated, by subtracting the first degree term (the term in which k=0) representing the fundamental wave from the feedback signal. The cross-correlation calculating unit 13 also acquires $f_5(p)$ that is the initial value of the fifth degree LTI transfer function using $f_1(p)$ and $f_3(p)$ thus calculated, by subtracting the first degree term and the third degree term from the feedback signal.

The cross-correlation calculating unit 13 then sets the initial value of $h^{(i)}_{2k+1}(p)$ representing the estimate of the LTI transfer function to be used in iteration as $f_{2k+1}(p)$. In other words, the cross-correlation calculating unit 13 sets $h^{(0)}_{2k+1}(p)=f_{2k+1}(p)$. The cross-correlation calculating unit 13 then performs the iteration using the initial value thus set. The iteration is performed in the manner described below, as an example.

To acquire the transfer function of a particular degree, the cross-correlation calculating unit 13 removes the influence of the transfer function of a lower degree(s) that is lower than the degree of the transfer function to be acquired, from the feedback signal. For example, to acquire $h_1(p)$ that is the estimate of the first degree transfer function, the cross-correlation calculating unit 13 uses $y_1(n)$ that is the output from the amplifier module 6 as it is. To acquire $h_3(p)$ that is the third degree estimate of the transfer function, the cross-correlation calculating unit 13 removes the influence of $h_1(p)$ that is the estimate of the first degree transfer function from $y_1(n)$ that is the output from the amplifier module 6. To acquire $h_5(p)$ that is the fifth degree estimate of the transfer function, the cross-correlation calculating unit 13 removes the influence of $h_1(p)$ that is the estimate of the first degree transfer function and the influence of $h_3(p)$ that is the estimate of the third degree transfer function from $y_1(n)$ that is the output from the amplifier module 6. Specifically, the cross-correlation calculating unit 13 calculates $V^{(i)}_{2k+1}(n)$ that is a value resulting from removing the influence of a lower degree transfer function(s) from $y_1(n)$ that is the output from the amplifier module 6, using Equation (1) below. The calculation expressed in Equation (1) is an example of "first calculation".

$$V^{(i)}_{2k+1}(n) = y_1(n) - \sum_{l=k} A_{2l+1} \sum_{p=0}^{p} h^{(i)}_{2l+1}(p) U^*_{2l+1}(n-p) \tag{1}$$

The cross-correlation calculating unit 13 calculates a cross-correlation function (CCF) of the $V^{(i)}_{2k+1}(n)$ that is a value in which the influence of a lower degree transfer function(s) is removed and $U^*_{2k+1}(n)$ that is the conjugate of the output from the amplifier module 6 when being memoryless. The cross-correlation calculating unit 13 then calculates the average of the cross-correlation functions thus calculated. Through this process, the cross-correlation calculating unit 13 acquires following Equation (2):

$$r^{(i+1)}_k(m) = \left\langle \sum_{m=-N/2}^{N/2} V^{(i)}_{2k+1}(n+m) U^*_{2k+1}(n) \right\rangle \tag{2}$$

In this equation, "< >" represents a statistical average of possible values of the data.

The cross-correlation calculating unit 13 then performs fast Fourier transform on $r^{(i+1)}_k(m)$, to acquire $R^{(i+1)}_k(\omega)$ that is the calculation result.

The cross-correlation calculating unit 13 then acquires the frequency characteristic of the LTI 61 and the LTI 63 expressed by following Equation (3). The calculation from the calculation of $V^{(i)}_{2k+1}(n)$ up to this point is an example of "second calculation".

$$H^{(i+1)}_{2k+1}(\omega_r) = \frac{R^{(i+1)}_k(\omega_r)}{A_{2k+1}|C^{(k)}_r|} \quad (3)$$

In this equation, $C^{(k)}_r$ is given as a product of modulation information for each of the sub-carriers in the OFDM signal. The sub-carrier modulation information is a complex signal. The input x(n) is the OFDM signal and expressed by following Equation (4):

$$x(n) = \sum_{\mu=-M/2}^{M/2} c_\mu \exp(j\omega_\mu n) \quad (4)$$

In this equation, $C_\mu$ is complex modulation information of each of the sub-carriers in the OFDM signal that is the input signal. $\omega_\mu$ is the frequency of each of the sub-carriers. Because $U_{2k+1}(n)$ is the third and the fifth degree terms, $U_{2k+1}(n)$ is expressed by following Equation (5):

$$U_{2k+1}(n) = \sum_{v=-M_k}^{M_k} C^{(k)}_v \exp(j\omega_v n) \quad (5)$$

In this equation, a relation between $M_k$ and M is expressed as $M_k=(2k+1)M/2$. C is given by following Equation (6) as a product of $C_\mu$ when the third degree is (k=1) and the fifth degree is (k=2):

$$C^{(k)}_v = \begin{cases} \sum c_{\mu 1} c_{\mu 2} c^*_{\mu 3} & (k=1) \\ \sum c_{\mu 1} c_{\mu 2} c_{\mu 3} c^*_{\mu 4} c^*_{\mu 5} & (k=2) \end{cases} \quad (6)$$

Because $C_\mu$ is sub-carrier information, $C_\mu$ is a random value dependent on the primary modulation of the OFDM signal that is the input signal.

In this manner, the cross-correlation calculating unit 13 acquires $H^{(i+1)}_1(\omega_r)$ (hereinafter simply referred to as "$H_1$") that is the first degree frequency characteristic of the LTI 61 and the LTI 63. The cross-correlation calculating unit 13 also acquires $H^{(i+1)}_3(\omega_r)$ (hereinafter simply referred to as "$H_3$") that is the third degree frequency characteristic of the LTI 61 and the LTI 63. The cross-correlation calculating unit 13 also acquires $H^{(i+1)}_5(\omega_r)$ (hereinafter simply referred to as "$H_5$") that is the fifth degree frequency characteristic of the LTI 61 and the LTI 63.

The cross-correlation calculating unit 13 then determines if $H_1$, $H_3$, and $H_5$ are converged. If $H_1$, $H_3$, and $H_5$ are not converged yet, the cross-correlation calculating unit 13 acquires $h^{(i)}_{2k+1}$ that is the transfer function of the LTI 61 and the LTI 63 by applying an inverse Fourier transform on $H_1$, $H_3$, and $H_5$ thus calculated.

The cross-correlation calculating unit 13 then performs the iteration using $h^{(i)}_{2k+1}$ that is the transfer function of the LTI 61 and the LTI 63 thus acquired. Specifically, the cross-correlation calculating unit 13 repeats a sequence of calculation of subtracting the influence of the transfer function of a lower degree(s) from the output from the amplifier module 6, calculating a cross-correlation function between the result and $U^*_{2k+1}(n)$, and acquiring $H^{(i+1)}_{k+1}(\omega_r)$ representing the frequency characteristic of the LTI 61 and the LTI 63.

Once $H_1$, $H_3$, and $H_5$ are converged, the cross-correlation calculating unit 13 performs an inverse Fourier transform on the converged values of $H_1$, $H_3$, and $H_5$ that are frequency characteristic of the LTI 61 and LTI 63, to acquire an estimate of the transfer function of the LTI 61 and the LTI 63. Specifically, the cross-correlation calculating unit 13 performs the calculation expressed by following Equation (7), to acquire $h^{(i+1)}_{2k+1}(p)$ that is the estimate of the transfer function of the LTI 61 and the LTI 63.

$$h^{(i+1)}_{2k+1}(p) = \sum_{r=-M_k}^{M_k} H^{(i+1)}_{2k+1}(\omega)\exp(j\omega_r p) \quad (7)$$

In this manner, the cross-correlation calculating unit 13 acquires $h^{(i+1)}_1(p)$ (hereinafter simply referred to as "$h_1(p)$") that is the estimate of the first degree transfer function of the LTI 61 and the LTI 63. The cross-correlation calculating unit 13 also acquires $h^{(i+1)}_3(p)$ (hereinafter simply referred to as "$h_3(p)$") that is the third degree estimate of the transfer function of the LTI 61 and the LTI 63. The cross-correlation calculating unit 13 also acquires $h^{(i+1)}_5(p)$ (hereinafter simply referred to as "$h_5(p)$") that is the fifth degree estimate of the transfer function of the LTI 61 and the LTI 63.

The cross-correlation calculating unit 13 then outputs $h_1(p)$, $h_3(p)$, and $h_5(p)$ that are the estimate of the transfer function thus acquired to the distortion compensating unit 3.

The DSP 10 calculates $h_1(p)$, $h_3(p)$, and $h_5(p)$ that are the estimates of the transfer function of the LTI 61 and the LTI 63 in a cyclic manner, at a frequency lower than the frequency at which $A_1$ to $A_5$ that are memoryless distortion compensation coefficients are updated. In calculating $h_1(p)$, $h_3(p)$, and $h_5(p)$, the DSP 10 uses the latest $A_1$ to $A_5$.

Figure 3:
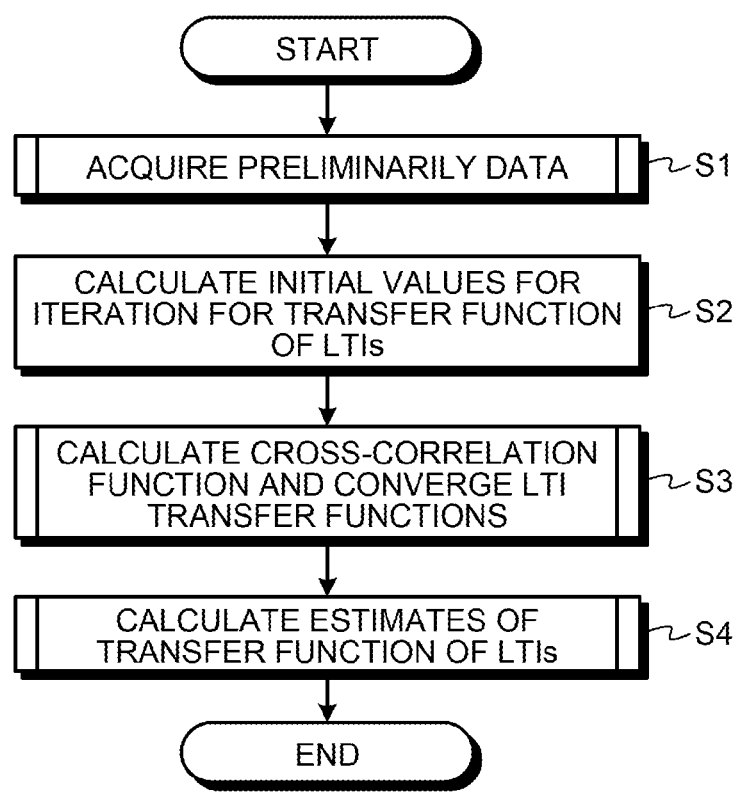
FIG. 3 is a flowchart illustrating a process of calculating an estimate of the transfer function of LTIs.

The process of calculating the estimates of the transfer function of the LTI 61 and the LTI 63 in the transmitter according to the embodiment will be explained with reference to FIG. 3. FIG. 3 is a flowchart illustrating the process of calculating the estimates of the transfer function of the LTIs. The entire process will be generally explained with reference to FIG. 3, and the detailed process at each step will be explained with reference to a subsequent flowchart.

The memoryless amplifier unit 11, the shift register 12, and the cross-correlation calculating unit 13 acquire preliminarily data (Step S1). Specifically, the memoryless amplifier unit 11 acquires the non-linearity coefficients $A_1$, $A_3$, and $A_5$ for the amplifier module 6 when being memoryless (in a narrow-band operation), which are estimated from the AM-to-AM characteristic and the AM-to-PM characteristic. The memoryless amplifier unit 11 receives x(n) that is the OFDM signal. The memoryless amplifier unit 11 then calculates an output from the amplifier module 6 when being memoryless for the OFDM signal, by adding nonlinear distortion to the OFDM signal thus received, using the non-linearity coefficient $A_1$, $A_3$, and $A_5$. The cross-correlation calculating unit 13 then acquires the output from the amplifier module 6 when being memoryless from the memoryless amplifier unit 11. The shift register 12 receives an input of the feedback signal ($y_1(n)$) that is the output from the amplifier module 6 from the A/D converter 9. The cross-correlation calculating unit 13 then receives an input of $y_1(n+m)$ that is the feedback signal having time shifted from the shift register 12.

The cross-correlation calculating unit 13 then calculates $f_1(p)$, $f_3(p)$, and $f_5(p)$ that are initial values for calculating the transfer function of the LTI 61 and the LTI 63 using each of these pieces of preliminarily data (Step S2).

The cross-correlation calculating unit 13 then calculates the cross-correlation function and performs the iteration, to acquire the converged values of $H_1$, $H_3$, and $H_5$ that are the frequency characteristics of the LTI 61 and the LTI 63, using $f_1(p)$, $f_3(p)$, and $f_5(p)$ that are the initial values (Step S3).

The cross-correlation calculating unit 13 acquires $h_1(p)$, $h_3(p)$, and $h_5(p)$ that are the estimates of the transfer function of the LTI 61 and the LTI 63, by performing an inverse Fourier transform on $H_1$, $H_3$, and $H_5$ representing the frequency characteristic of the LTI 61 and the LTI 63 thus calculated (Step S4).

The process of acquiring the preliminarily data performed at Step S1 in FIG. 3 will now be explained in detail with reference to FIG. 4. FIG. 4 is a flowchart of the process of acquiring the preliminary data.

The memoryless amplifier unit 11 acquires the non-linearity coefficients $A_1$, $A_3$, and $A_5$ for the amplifier module 6 when being memoryless (Step S101).

The baseband signal generating unit 1 generates the OFDM signal that is a baseband signal (Step S102). The memoryless amplifier unit 11 receives an input of the OFDM signal from the baseband signal generating unit 1.

The memoryless amplifier unit 11 calculates $U_{2k+1}(n)=|x(n)|^{2k}x(n)$ (k=0, 1, 2, 3 . . . ) that is the equation of each of the degrees included in the OFDM signal (Step S103). The memoryless amplifier unit 11 outputs $U_{2k+1}(n)$ that is the equation of each of the degrees included in the OFDM signal to the cross-correlation calculating unit 13.

The cross-correlation calculating unit 13 receives an input of $U_{2k+1}(n)$ that is the equation of each of the degrees included in the OFDM signal from the memoryless amplifier unit 11. The cross-correlation calculating unit 13 then acquires the conjugate of $U_{2k+1}(n)$ and calculates $U^*_{2k+1}(n)$ (k=0, 1, 2, . . . ) that is the non-linearity term to be used in the iteration (Step S104).

The shift register 12 receives an input of $y_1(n)$ that is the output from the amplifier module 6 from the A/D converter 9 (Step S105). The cross-correlation calculating unit 13 then acquires $y_1(n+m)$ that is the output from the amplifier module 6 having time shifted from the shift register 12.

The calculation of the initial values used for the iteration performed at Step S3 and Step S4 in FIG. 3 will be explained in detail with reference to FIG. 5. FIG. 5 is a flowchart of the process of calculating the initial values to be used for the iteration.

The cross-correlation calculating unit 13 sets the initial value of $h^{(i)}_{2k+1}(p)$ that is the transfer function of the LTI to be used in iteration as $f_{2k+1}(p)$ (Step S201). In other words, the cross-correlation calculating unit 13 sets $h^{(0)}_{2k+1}(p)=f_{2k+1}(p)$.

The cross-correlation calculating unit 13 then subtracts the influence of the transfer function of a lower degree(s) that is lower than the degree of the transfer function to be acquired from $y_1(n)$ that is the output from the amplifier module 6 (Step S202). Specifically, the cross-correlation calculating unit 13 performs the calculation of Equation (1).

The cross-correlation calculating unit 13 calculates a cross-correlation function between the result of subtracting the influence of the transfer function of a lower degree(s) from $y_1(n)$ that is the output from the amplifier module 6 and $U^*_{2k+1}(n)$ that is the non-linearity term (Step S203). The cross-correlation calculating unit 13 then takes an average of the cross-correlation functions thus calculated. In this manner, the cross-correlation calculating unit 13 acquires Equation (2).

The cross-correlation calculating unit 13 then performs fast Fourier transform on $r^{(i+1)}_k(m)$ acquired in Equation (2), to acquire $R^{(i+1)}_k(\omega)$ that is the calculation result. The cross-correlation calculating unit 13 then calculates $H_1$, $H_3$, and $H_5$ that are frequency characteristics of the LTI 61 and the LTI 63 expressed by Equation (3) above (Step S204).

The cross-correlation calculating unit 13 determines if $H_1$, $H_3$, and $H_5$ that are the frequency characteristics of the LTI 61 and the LTI 63 thus calculated are converged (Step S205). If $H_1$, $H_3$, and $H_5$ are not converged yet (NO at Step S205), the cross-correlation calculating unit 13 returns to Step S202 and repeats the iteration.

If $H_1$, $H_3$, and $H_5$ that are frequency characteristic of the LTI 61 and the LTI 63 are converged (YES at Step S205), the cross-correlation calculating unit 13 performs the following operation. The cross-correlation calculating unit 13 performs inverse Fourier transform on the converged values of $H_1$, $H_3$, and $H_5$ and calculates $h_1(p)$, $h_3(p)$, and $h_5(p)$ that are the estimates of the transfer function of the LTI 61 and the LTI 63 expressed by Equation (7) (Step S206).

As described above, the transmitter according to the embodiment calculates the transfer function of the LTI representing distortion caused by a memory effect, calculates the non-linearity coefficient representing distortion caused by the AM-to-AM characteristic and the AM-to-PM characteristic of the amplifier circuit in a separate manner, and updates the distortion coefficient by combining the two. In other words, fast varying nonlinear distortion caused by the amplifier circuit is compensated through conventional predistortion. For slow varying nonlinear distortion caused by the LTI, parameters are tracked at a longer cycle, and such distortion is compensated using an algorithm for reducing the memory effect. In this manner, the calculation for compensating for distortion caused by the memory effect does not need to be performed between the calculation for compensating for non-linear distortion caused by the amplifier circuit. Therefore, it is possible to reduce the number of times the compensating calculation for reducing the memory effect is performed, which requires a large amount of calculation, and the distortion compensation corresponding to the memory effect can be performed highly precisely with a small amount of calculation. Furthermore, compensation for the distortion caused by the amplifier circuit can be calculated quickly.

According to one aspect of the distortion compensating apparatus, the transmitter, the distortion compensating method, and the transfer function calculating method according to an embodiment, high performance distortion compensation can be achieved with a small amount of calculation.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A distortion compensating apparatus comprising:
an amplifier that amplifies an input signal and is expressed by a model having a first Linear Time Invariant (LTI)

filter that is a linear time-invariant filter for limiting a bandwidth of the input signal, an amplifier circuit that amplifies a signal output from the first LTI filter, and a second LTI filter that is a linear time-invariant filter for limiting a bandwidth of a signal output from the amplifier circuit;

a memoryless amplifier unit that acquires a term of each degree from a measurement of the amplitude modulation (AM)-to-AM characteristic and AM-to-phase modulation (PM) characteristic of the amplifier circuit, acquires an estimate of a non-linearity coefficient, and calculates an output from the amplifier when being memoryless for a first input signal based on the estimate;

a cross-correlation calculating unit that calculates a correlation between a signal output from the amplifier for the first input signal and an output for the first input signal calculated by the memoryless amplifier unit and calculates an estimate of a transfer function of the first LTI filter and the second LTI filter based on a resultant correlation thus calculated; and a distortion compensating unit that compensates a second input signal based on the estimate of the transfer function calculated by the cross-correlation calculating unit and outputs the second input signal thus compensated to the amplifier.

2. The distortion compensating apparatus according to claim 1, wherein the distortion compensating unit acquires a non-linearity coefficient for compensating for distortion caused by the amplifier circuit based on the first input signal and the signal output from the amplifier for the first input signal, calculates a distortion compensation coefficient based on the transfer function and the non-linearity coefficient, and compensates the second input signal based on the distortion compensation coefficient thus calculated.

3. The distortion compensating apparatus according to claim 1, wherein the cross-correlation calculating unit calculates frequency characteristics of the first LTI filter and the second LTI filter by performing, for each degree, first calculation for subtracting an influence of a transfer function of the other degrees from the signal output from the amplifier and second calculation for calculating a cross-correlation function between a result of the first calculation and a conjugate of the output calculated by the memoryless amplifier unit, iterates the first calculation and the second calculation until the frequency characteristics of the first LTI filter and the frequency characteristic of the second LTI filter are converged, and calculates the estimate of the transfer function based on converged values of the frequency characteristics of the first LTI filter and the second LTI filter.

4. A transmitter comprising:
a baseband unit that generates a baseband signal;
an amplifier that amplifies an input signal and is expressed by a model having a first Linear Time Invariant (LTI) filter that is a linear time-invariant filter for limiting a bandwidth of the input signal, an amplifier circuit that amplifies a signal output from the first LTI filter, and a second LTI filter that is a linear time-invariant LTI filter for limiting a bandwidth of a signal output from the amplifier circuit;
a memoryless amplifier unit that acquires a term of each degree from a measurement of the amplitude modulation (AM)-to-AM characteristic and AM-to-phase modulation (PM) characteristic of the amplifier circuit, acquires an estimate of a non-linearity coefficient, and calculates an output from the amplifier when being memoryless for the input signal based on the estimate;
a cross-correlation calculating unit that calculates a correlation between a signal output from the amplifier for the first input signal and an output for the input signal calculated by the memoryless amplifier unit and calculates an estimate of a transfer function of the first LTI filter and the second LTI filter based on a resultant correlation thus calculated; and
a distortion compensating unit that compensates the baseband signal based on the estimate of the transfer function calculated by the cross-correlation calculating unit and outputs the baseband signal thus compensated to the amplifier.

5. A distortion compensating method for an amplifier represented by a model having a first Linear Time Invariant (LTI) filter that is a linear time-invariant filter for limiting a bandwidth of an input signal, an amplifier circuit that amplifies a signal output from the first LTI filter, and a second LTI filter that is a linear time-invariant filter for limiting a bandwidth of a signal output from the amplifier circuit, the distortion compensating method comprising:
acquiring a term of each degree from a measurement of the amplitude modulation (AM)-to-AM characteristic and AM-to-phase modulation (PM) characteristic of the amplifier circuit;
acquiring an estimate of a non-linearity coefficient;
calculates an output from the amplifier when being memoryless for the first input signal based on the estimate;
calculating a correlation between a signal output from the amplifier for the first input signal and the output from the amplifier when being memoryless for the first input signal;
calculating an estimate of a transfer function of the first LTI filter and the second LTI filter based on a result of the calculation; and
compensating a second input signal based on the transfer function thus calculated and outputting the second input signal thus compensated to the amplifier.

6. A transfer function calculating method for an amplifier represented by a model having a first Linear Time Invariant (LTI) filter that is a linear time-invariant filter for limiting a bandwidth of an input signal, an amplifier circuit that amplifies a signal output from the first LTI filter, and a second LTI filter that is a linear time-invariant filter for limiting a bandwidth of a signal output from the amplifier circuit, the transfer function calculating method comprising:
acquiring a term of each degree from a measurement of the amplitude modulation (AM)-to-AM characteristic and AM-to-phase modulation (PM) characteristic of the amplifier circuit;
acquiring an estimate of a non-linearity coefficient;
calculates an output from the amplifier when being memoryless for the first input signal based on the estimate;
calculating a correlation between a signal output from the amplifier for the first input signal and the output from the amplifier when performing memoryless amplification for the first input signal; and
calculating an estimate of a transfer function of the first LTI filter and the second LTI filter based on a result of the calculation.

* * * * *